(12) United States Patent
Kammeter

(10) Patent No.: US 6,330,516 B1
(45) Date of Patent: Dec. 11, 2001

(54) BRANCH CIRCUIT MONITOR

(75) Inventor: John B. Kammeter, Sandston, VA (US)

(73) Assignee: Power Distribution, Inc., Richmond, VA (US)

( * ) Notice: Subject to any disclaimer, the term of this patent is extended or adjusted under 35 U.S.C. 154(b) by 0 days.

(21) Appl. No.: 09/535,973

(22) Filed: Mar. 27, 2000

(51) Int. Cl.$^7$ .................................................. G01R 31/02

(52) U.S. Cl. ............................... 702/60; 702/57; 702/62; 702/64; 702/122

(58) Field of Search ..................... 702/57, 58, 59, 702/62, 64, 122, 118, 117, 182, 185, 189, FOR 103, FOR 104, FOR 106, FOR 111, FOR 132, FOR 135, FOR 170, FOR 171; 361/60–66

(56) References Cited

U.S. PATENT DOCUMENTS

| | | | |
|---|---|---|---|
| 4,322,766 | * 3/1982 | Backer et al. | 361/17 |
| 4,335,437 | 6/1982 | Wilson et al. | |
| 4,384,251 | * 5/1983 | Schelling et al. | 324/207 |
| 4,409,635 | * 10/1983 | Kraus | 361/62 |
| 4,752,853 | * 6/1988 | Matsko et al. | 361/94 |
| 4,858,141 | 8/1989 | Hart et al. | |
| 4,904,873 | * 2/1990 | Kiihn | 250/424 |
| 5,140,263 | * 8/1992 | Leon | 324/207.17 R |
| 5,196,982 | 3/1993 | Landsberg et al. | |
| 5,224,054 | 6/1993 | Wallis | |
| 5,414,344 | * 5/1995 | Chinn | 324/72 |
| 5,442,280 | 8/1995 | Baudart | |
| 5,572,438 | * 11/1996 | Ehlers et al. | 364/492 |
| 5,583,440 | * 12/1996 | Bisher | 324/426 |
| 5,615,075 | 3/1997 | Kim | |
| 5,671,147 | * 9/1997 | McKim, Jr. et al. | 364/481 |

(List continued on next page.)

FOREIGN PATENT DOCUMENTS

| | | |
|---|---|---|
| 3712190 | 10/1988 | (DE) . |
| 3743064 | 3/1989 | (DE) . |
| 4204515 | 8/1993 | (DE) . |
| 0288998 | 11/1988 | (EP) . |
| 2274171 | 7/1994 | (GB) . |
| 022237057-A | * 9/1990 | (JP) . |
| 11017511-A | * 1/1999 | (JP) . |
| 11238448-A | * 8/1999 | (JP) . |
| 11341713-A | * 12/1999 | (JP) . |
| 200078764-A | * 3/2000 | (JP) . |
| WO9816839 | 4/1998 | (WO) . |
| WO9946606 | 9/1999 | (WO) . |

OTHER PUBLICATIONS

Wahl, Frank P., *Select Current Sensor Performance to Match the Application's Requirements*, PCIM Magazine, pp. 1–11, 1998.
POWERLOGIC® Power Monitoring and Control Systems, Energy and Enercept Meters, Class 3020, 3050, pp. 1–2.

*Primary Examiner*—Marc S. Hoff
*Assistant Examiner*—Carol S. Tsai
(74) *Attorney, Agent, or Firm*—Bacon & Thomas

(57) ABSTRACT

A branch circuit monitor includes a plurality of non-contact current sensors arranged to sense current on each of a plurality of branch circuits, the non-contact current sensors being connected to a common digital signal processor (DSP) module having as inputs the outputs of the current sensors and also voltage inputs from each power source. The digital signal processor is arranged to calculate not only overall energy consumption, but also RMS voltage, RMS current, power factor, real power, and/or apparent power for each branch circuit. Preferably, the non-contact current sensors are in the form of miniature non-contact Rogowski coils or induction transducers. Data from the digital signal processor may be made available via communications protocols such as Modbus RTU or RS232/RS485/422, to any number of remote sites. The individual branch circuit monitors can be wired in a daisy chain or star network configuration and even connected to the Internet via an appropriate interface device.

9 Claims, 3 Drawing Sheets

U.S. PATENT DOCUMENTS

| | | | |
|---|---|---|---|
| 5,767,667 | * 6/1998 | Shafie | 324/117 |
| 5,796,237 | 8/1998 | Yamakawa . | |
| 5,811,965 | * 9/1998 | Gu | 324/117 R |
| 5,877,618 | * 3/1999 | Luebke et al. | 324/72.5 |
| 5,995,911 | * 11/1999 | Hart | 702/64 |
| 6,006,105 | * 12/1999 | Rostoker et al. | 455/552 |
| 6,018,700 | * 1/2000 | Edel | 702/60 |
| 6,038,117 | * 3/2000 | Dullni et al. | 361/58 |
| 6,038,516 | * 3/2000 | Alexander et al. | 702/67 |
| 6,091,223 | * 7/2000 | Rogers et al. | 320/111 |
| 6,097,202 | * 8/2000 | Takahashi | 324/761 |
| 6,109,094 | * 8/2000 | Baranzahi et al. | 73/31.06 |
| 6,118,270 | * 9/2000 | Singer et al. | 324/117 R |
| 6,211,627 | * 4/2001 | Callahan | 315/294 |

* cited by examiner

BRANCH CIRCUIT MONITOR

BACKGROUND OF THE INVENTION

1. Field of the Invention

This invention relates to power distribution systems, and more particularly to apparatus for monitoring power usage by a plurality of loads connected to a panel board or circuit breaker. The invention utilizes non-contact current sensors wired to the panel board or breaker and a digital signal processor module connected to receive inptus from the current sensor and from each voltage source so as to avoid having to attach a separate meter to each branch circuit to be monitored. The digital signal processor also enables monitoring of power quality as well as energy consumption for each branch circuit.

2. Description of Related Art

In order to audit or monitor energy usage in a more efficient manner, it is often desirable to monitor not only the overall energy usage by a facility, but also power consumption by individual branch circuits, as well as the effect on power quality of loads in the branch circuits. Such individual branch circuit monitoring not only permits billing for energy used, but also can provide an indication of conditions in the branch circuit, and trigger alerts in case individual limits on such parameters as RMS voltage or current, power factors, or harmonic distortion are exceeded. Furthermore, individual branch circuit monitoring permits billing to be extended to take into account low power factors and/or high total harmonic distortion, promoting efficiency by allowing the operator of a facility to determine whether and where capital investment for power quality enhancement equipment would provide the best return on investment.

Presently, monitoring of individual branch circuits in order to measure branch power parameters such as energy usage by a load, and the effects of the load on power factor and total harmonic distortion (THD), requires the installation of individual current sensors encircling and tied to the wire conductors of the branch circuits that the installer connects from the load to the branch circuit breakers. In order to record energy used, a conventional kilowatt-hour meter needs to be attached to each branch circuit. The costs involved in monitoring branch circuit energy usage can be significant for a typical manufacturing facility, in which multiple discrete circuit breakers or power distribution panels each typically service up to 84 branch circuits. When power quality or other parameters are to be taken into account, the costs rapidly become prohibitive due to the need for installation of additional meters.

SUMMARY OF THE INVENTION

It is accordingly a first objective of the invention to overcome the deficiencies of the prior art by providing a branch circuit monitor that can be wired directly to the panel board or circuit breaker without having to attach sensors to every branch circuit wire, and without requiring multiple kilowatt-hour meters for each circuit.

It is a second objective of the invention to provide a branch circuit monitor which is not limited to monitoring kilowatt-hours, but rather is capable of measuring, for each of a plurality of branch circuits, any or all of the following parameters: power factor, root-mean-square (RMS) current, RMS voltage, apparent power(kw)or real power (kv), total energy usage (kwhours), percent loading, and voltage and current THD.

It is a third objective of the invention to provide a branch circuit monitor capable of issuing, for each of a plurality of branch circuits, alarms on any or all of the following parameters: over/under voltage, over current and/or excess power or voltage consumption, high power factor and/or THD, and overall energy usage in multiple kwhr increments.

It is a fourth objective of the invention to provide a branch circuit monitor capable of generating, for each of plurality of individual branch circuits, real time data that can be used for billing of energy used, for calculating credits for energy that is out-of-tolerance, for levying surcharges for low power factors and/or high total harmonic distortion, and for determining whether the capital investment for power quality enhancement equipment would result in a positive return on investment.

It is a fifth objective of the invention to provide a branch circuit monitor that can be customized to provide any type of indication required by a particular application or facility, and which is scalable to allow for monitoring not only of any number of local branch circuits, but also remote sites in any number of cities or countries.

These objectives are achieved, in accordance with the principles of a preferred embodiment of the invention, by replacing the conventional individual current sensors tied to the wire conductors of the branch circuits with a plurality of non-contact current sensors, one for each branch circuit, and by utilizing a digital signal processor (DSP) module connected not only to the current sensors but also to voltage inputs from each voltage source to process the inputs from the current sensors.

In an especially preferred embodiment of the invention, the digital signal processor module monitors not only overall energy usage, but also RMS voltage, RMS current, power factor, real power, apparent power, and frequency for each branch circuit.

While not limited to a particular type of non-contact or induction transducer, the non-contact current sensors of the illustrated embodiment are in the form of miniature non-contact Rogowski coils that can easily be fitted on printed circuit boards arranged to fit within the dimensions of a typical panel board.

The inclusion of a digital signal processor module allows the branch circuit monitor to make data available, via communications protocols such as Modbus RTU or RS232/RS485/422, to any number of remote sites. The individual branch circuit monitors can be wired in a daisy chain or star network configuration and even connected to the Internet via an appropriate interface device so as to enable centralized billing or auditing of power usage, and remote monitoring of branch circuit conditions.

DETAILED DESCRIPTION OF THE PREFERRED EMBODIMENTS

Figure 1:
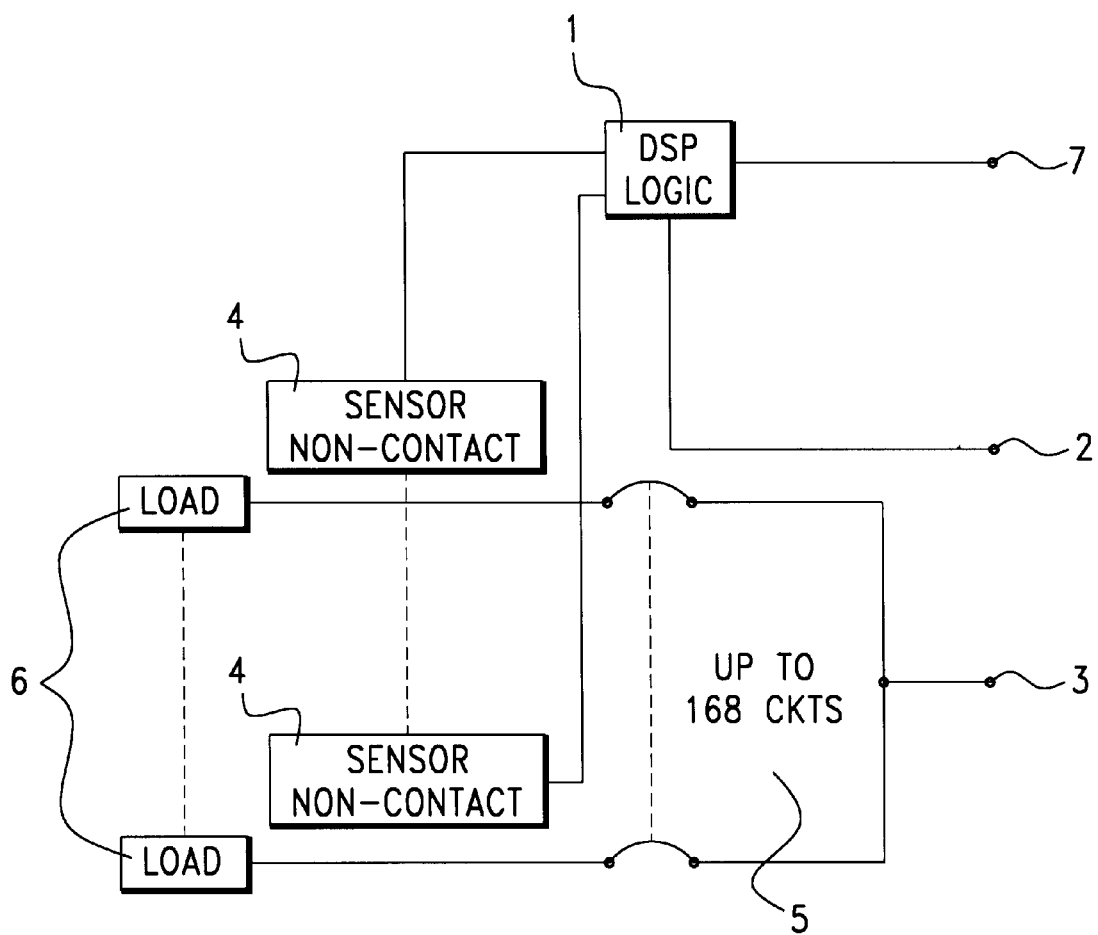
FIG. 1 is a schematic diagram illustrating the principal components of a branch circuit monitor arranged according to the principles of a preferred embodiment of the invention.

As illustrated in FIG. 1, the branch circuit monitor of the preferred embodiment of the invention includes a digital signal processor (DSP) 1 arranged to carry out various calculations based on a voltage input 2 from each of a plurality of power sources 3, and on a current input from each of a plurality of non-contact current sensors 4, one current sensor being provided between each branch circuit breaker 5 and a corresponding load 6.

Those skilled in the art will appreciate that numerous DSPs capable of performing the requisite voltage and current monitoring calculations are currently available, and that the invention is not limited to a particular digital signal processor configuration, or to a particular calculation. Although it is believed that digital signal processors have not been used in the specific context of branch circuit monitor as illustrated herein, suitable digital signal processors and programs capable of carrying out the requisite power analysis calculations or determinations are found in a variety of existing electrical testing and monitoring equipment.

The DSP used in the branch circuit monitor of the preferred embodiment of the invention should at least be capable of monitoring the frequency of a signal, measuring harmonics using an appropriate transform, monitoring of total energy consumption, and of carrying out the following standard, well-known calculations (or equivalents thereof) based on the input voltage and current:

(i) RMS current and voltage:

$$I_{RMS} = \left[\frac{1}{T}\int_a^{a+T} i^2 dt\right]^{1/2} \text{ and } V_{RMS} = \left[\frac{1}{T}\int_a^{a+T} v^2 dt\right]^{1/2};$$

(ii) Active Power:

$$P_{active} = \frac{1}{T}\int_{t_0-T/2}^{t_0+T/2} p\, dt \text{ where } p = E_\alpha I_\alpha \cos(\alpha - \beta);$$

(iii) Apparent Power:
$P_{apparent} = V_{RMS} I_{RMS}$;
(iv) Power Factor:
$PF = P_{active}/P_{apparent}$; and
(v) Total Harmonic Distortion:
Ratio of (a) the sum of the powers of all harmonic frequencies above the fundamental frequency to (b) the power of the fundamental frequency.

The specific manner in which the digital signal processor performs the above calculations is not part of the invention, but it will be appreciated that a number of digital signal processor software algorithms are available for determining in real time, without storing entire waveforms and without dependence on exact endpoints, the values of each of the individual voltage and current harmonics for 84 or more branch circuits. By minimizing the number of accuracy determining hardware components and electronic components, and by utilizing the minimum number of individual current and voltage channels for the respective branch circuits through the actual analog signals flow, maximum accuracy can be obtained, while time disparities can be eliminating in well-known fashion by simultaneously sampling related channels, or by alternatively sampling and then over sampling. As the induced sampling error is almost zero in the arrangement of the preferred embodiment, mismatching which would occur if a number of simultaneous channels are used.

If required by the particular application, each channel can be calibrated for scale and offset, via a service port which can be connected to a terminal, pendant, or computer, and which can also read all values and set a network address. The calibration, network address, and historic data may be stored in nonvolatile memory. If all inputs are connected to known inputs, a single command will test and calibrate all channels, with reports on incorrectly wired channels.

Digital signal processor 1 is preferably connected to a communications interface 7 so as to make data available to remote as well as local points via such protocols as Modbus RTU in a four-wire drop configuration, or any other protocol such as RS232/RS485/422, and wired or wireless data transmission for display on a spreadsheet or other suitable application software. In addition, the digital signal processor module may include an optional storage (not shown) for recording and logging outages.

Figure 2B:
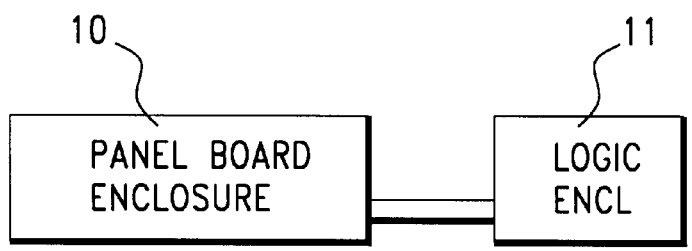
FIG. 2B is a top view of the arrangement illustrated in FIG. 2A.
Figure 2A:
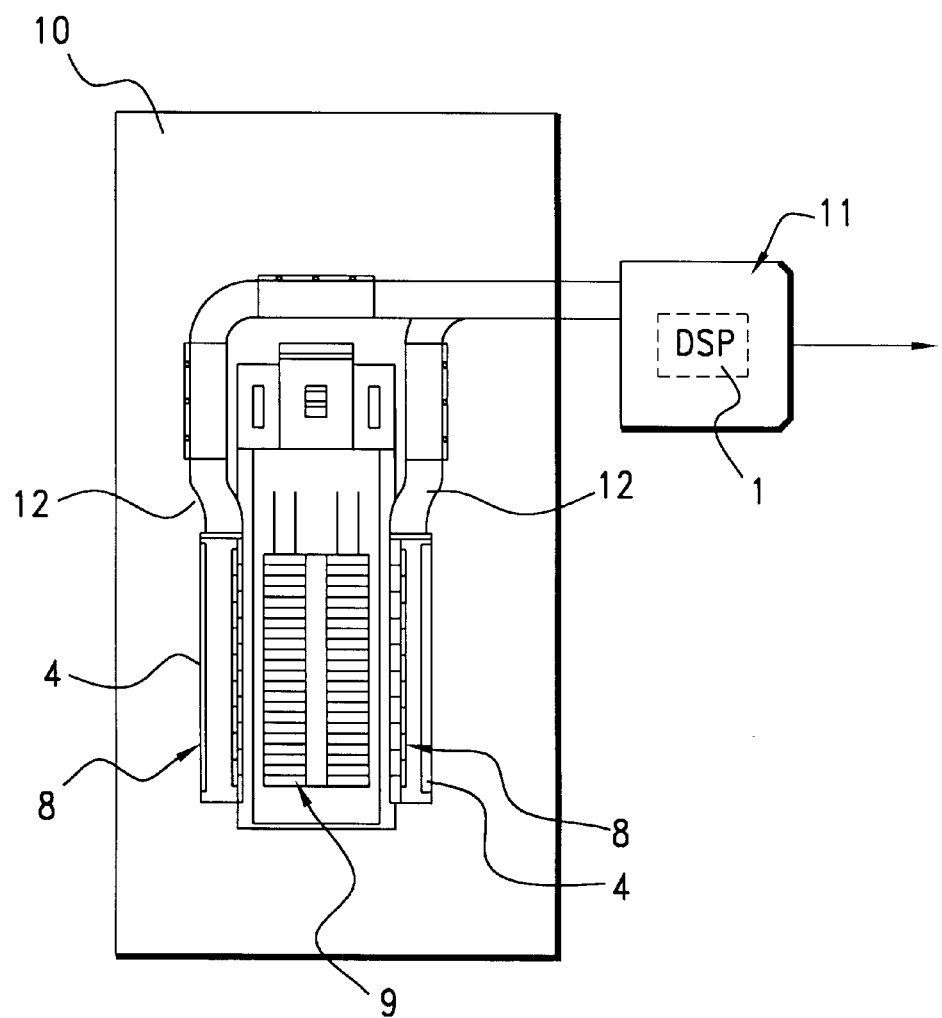
FIG. 2A is a side view showing an arrangement of the preferred branch circuit monitor on an 84-circuit panel board.
Figure 3:
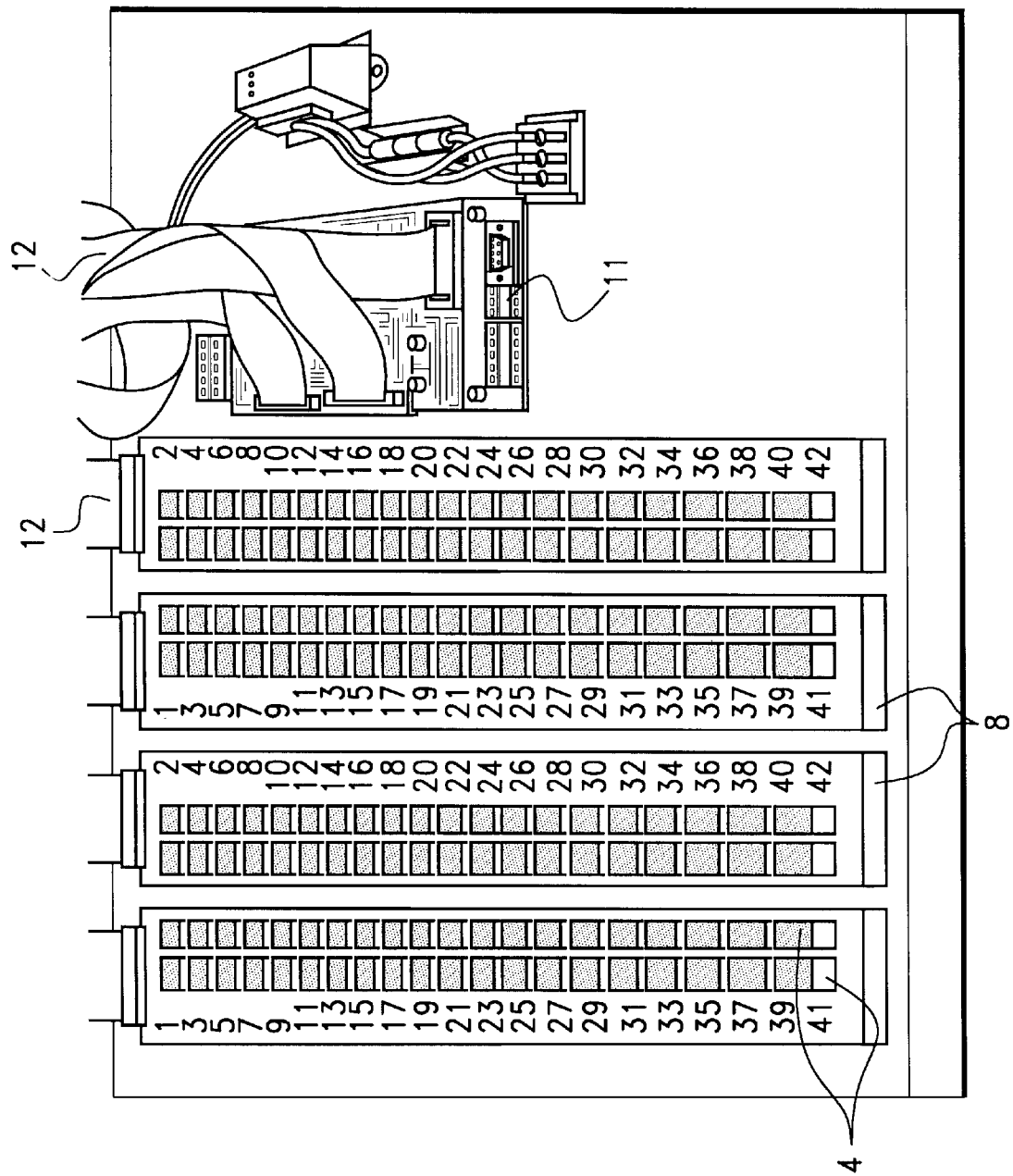
FIG. 3 is a perspective view of various components of the branch circuit monitor of FIGS. 1, 2A, and 2B.

As illustrated in FIGS. 2A, 2B, and 3, the non-contact sensors 4 are preferably located on printed circuit boards 8 mounted on directly wired to a panel board 9 within a panel board enclosure 10. Digital signal processor 1 is housed in a logic module 11 connected to printed circuit boards 8 by ribbon cables 12. Typical dimensions for the panel board enclosure are given in FIG. 2A, although those skilled in the art will appreciate that the dimensions should not be taken as limiting. As illustrated in FIG. 3, the logic module is in the form of a circuit card having a serial output port, and that is supplied with 20 V AC power through a transformer 13, time delay fuse 14, and terminal strip 15.

The branch circuit module of the preferred embodiment thus provides real-time and history information on branch circuit parameters for site power networks having as many as 168 or more branch circuits. Although a specific arrangement of sensors and circuit boards is shown, those skilled in the art will appreciate that the physical arrangement of monitor components may be varied depending on the application, as may such features as the communications circuitry and data format. For example, the data output from the digital signal processor module may be either a serial or parallel output, and can be in the form either of absolute values or billing blocks, i.e., increments, or the monitor could be arranged to provide both absolute values and billing blocks.

Having thus described a preferred embodiment of the invention and variations of the preferred embodiment in sufficient detail to enable those skilled in the art to make and use the invention, it will nevertheless be appreciated that numerous variations and modifications of the illustrated embodiment may be made without departing from the spirit of the invention. Accordingly, it is intended that the invention not be limited by the above description or accompanying drawings, but that it be defined solely in accordance with the appended claims.

What is claimed is:

1. A branch circuit monitor for monitoring parameters of power on each of a plurality of branch circuits extending from a panel board or circuit breaker box, said panel board or circuit breaker box including a plurality of circuit breakers arranged to distribute power from a main line that is terminated within the panel board or circuit breaker box to a plurality of branch circuits, comprising:

a plurality of non-contact current sensors arranged to monitor currents in wires of branch circuits extending from said panel board or circuit breaker box, said non-contact current sensors surrounding said branch circuit wires; and a controller module, wherein the controller module is connected to an output of the non-contact current sensors, and wherein the controller module is arranged to process, for each of said branch circuits, currents measured by the non-contact current sensors, and wherein said non-contact sensors are mounted on a circuit board positioned near to said panel board or circuit breaker box.

2. A branch circuit monitor as claimed in claim 1, herein the controller module is a digital signal processor (DSP) module and is further connected to said main line and arranged to monitor a voltage of power supplied to said main line from at least one power source and to process both said main line voltage and said branch circuit currents in order to measure energy usage and at least one additional parameter selected from the group consisting of RMS voltage, RMS current, power factor, real power, and apparent power.

3. A branch circuit monitor as claimed in claim 1, wherein the non-contact current sensors are miniature non-contact Rogowski coils.

4. A branch circuit monitor as claimed in claim 1, wherein the non-contact current sensors are induction transducers.

5. A branch circuit monitor as claimed in claim 2, wherein said at least one additional parameter includes RMS voltage and RMS current.

6. A branch circuit monitor as claimed in claim 2, wherein said at least one additional parameter includes power factor.

7. A branch circuit monitor as claimed in claim 2, wherein said at least one additional parameter includes total harmonic distortion.

8. A branch circuit monitor as claimed in claim 1, further comprising a remote communications interface arranged to permit transfer of data from the digital signal processor module to a location remote from said panel board or circuit breaker box, thereby enabling multiple said panel boards or circuit breaker boxes, each with its own digital signal processor and remote communications interface, to be monitored from a central location.

9. A branch circuit monitor as claimed in claim 2, wherein said digital processor module is arranged to issue alarms for at least one condition selected from the group consisting of over voltage, under voltage, over current, excessive active or apparent power, high power factor, and high total harmonic distortion.

* * * * *